United States Patent
Huang et al.

(10) Patent No.: US 8,933,719 B2
(45) Date of Patent: Jan. 13, 2015

(54) COMBINED PROBE HEAD FOR A VERTICAL PROBE CARD AND METHOD FOR ASSEMBLING AND ALIGNING THE COMBINED PROBE HEAD THEREOF

(75) Inventors: Chao-Ching Huang, Chu-Pei (TW); Wen-Chi Chen, Chu-Pei (TW); Chiu-Chu Chang, Chu-Pei (TW)

(73) Assignee: MPI Corporation, Chu-Pei (TW)

( * ) Notice: Subject to any disclaimer, the term of this patent is extended or adjusted under 35 U.S.C. 154(b) by 665 days.

(21) Appl. No.: 13/189,572

(22) Filed: Jul. 25, 2011

(65) Prior Publication Data
US 2012/0025859 A1 Feb. 2, 2012

(30) Foreign Application Priority Data
Jul. 27, 2010 (TW) ................. 99124636 A

(51) Int. Cl.
| | |
|---|---|
| *G01R 31/00* | (2006.01) |
| *G01R 1/073* | (2006.01) |
| *G01R 31/28* | (2006.01) |
| *G01R 3/00* | (2006.01) |

(52) U.S. Cl.
CPC ........ *G01R 1/07342* (2013.01); *G01R 31/2889* (2013.01); *G01R 3/00* (2013.01)
USPC ............... 324/756.03; 257/48; 324/750.25; 324/72.5; 324/750.16; 73/866.5

(58) Field of Classification Search
CPC .. G01R 1/073; G01R 1/07307; G01R 1/0408; G01R 1/0491; G01R 31/2886; G01R 31/2889; G01R 31/26; G01R 3/00; H01L 24/96
USPC ......... 438/FOR. 101, FOR. 364; 324/756.03, 324/756.04, 756.07
See application file for complete search history.

(56) References Cited

U.S. PATENT DOCUMENTS

| | | | | |
|---|---|---|---|---|
| 4,554,506 | A * | 11/1985 | Faure et al. | 324/750.25 |
| 4,904,935 | A * | 2/1990 | Calma et al. | 324/756.03 |
| 5,530,371 | A * | 6/1996 | Perry et al. | 324/756.03 |
| 6,078,187 | A * | 6/2000 | Hanners et al. | 324/756.03 |
| 6,489,788 | B2 * | 12/2002 | Sausen | 324/756.03 |
| 7,388,392 | B2 * | 6/2008 | Brandorff | 324/756.04 |
| 7,898,242 | B2 * | 3/2011 | Eldridge et al. | 324/756.03 |
| 8,004,296 | B2 * | 8/2011 | Di Stefano et al. | 324/750.19 |
| 8,058,889 | B2 * | 11/2011 | Williams | 324/756.03 |
| 2003/0146769 | A1 * | 8/2003 | McQuade et al. | 324/754 |
| 2004/0051546 | A1 * | 3/2004 | Thiessen | 324/761 |
| 2005/0156165 | A1 * | 7/2005 | Eldridge et al. | 257/48 |
| 2007/0103178 | A1 * | 5/2007 | Kasukabe et al. | 324/754 |
| 2008/0054918 | A1 * | 3/2008 | Lin et al. | 324/754 |

(Continued)

*Primary Examiner* — Benjamin M Baldridge
(74) *Attorney, Agent, or Firm* — Ding Yu Tan

(57) ABSTRACT

A combined probe head being disposed in a space transformer of a vertical probe card is provided, in which the combined probe head is used for differentiating or segmenting a layout area of the probes in the vertical probe card. The combined probe head may include a locating plate and sub-probe heads. The locating plate may include fixed portions. Each sub-probe head may include corresponding sub-dies and probes inserted between the sub-dies, and each sub-probe head is assembled and fixed in the corresponding fixed portion. Therefore, the layout area of the probes in the vertical probe card can be respectively differentiated or segmented from the sub-probe heads in order to avoid mutual interference under repair process. In addition, a related method for assembling and aligning the above mentioned combined probe head is provided.

18 Claims, 11 Drawing Sheets

(56) References Cited

U.S. PATENT DOCUMENTS

| | | | |
|---|---|---|---|
| 2009/0002009 A1* | 1/2009 | Brandorff | 324/758 |
| 2010/0045322 A1* | 2/2010 | Di Stefano et al. | 324/758 |
| 2010/0117669 A1* | 5/2010 | Clarke et al. | 324/757 |
| 2010/0127722 A1* | 5/2010 | Hung | 324/754 |
| 2010/0148811 A1* | 6/2010 | Cho et al. | 324/754 |
| 2010/0164518 A1* | 7/2010 | Yamada et al. | 324/754 |
| 2010/0176831 A1* | 7/2010 | Palcisko et al. | 324/757 |
| 2010/0225344 A1* | 9/2010 | Eldridge et al. | 324/754 |
| 2010/0301888 A1* | 12/2010 | Yonezawa et al. | 324/756.03 |
| 2010/0308855 A1* | 12/2010 | Pagani | 324/756.03 |
| 2011/0031991 A1* | 2/2011 | Lee et al. | 324/756.03 |
| 2011/0121851 A1* | 5/2011 | Lee et al. | 324/756.03 |
| 2011/0128028 A1* | 6/2011 | Lin et al. | 324/756.03 |
| 2011/0221465 A1* | 9/2011 | Lee | 324/756.03 |
| 2012/0007627 A1* | 1/2012 | Chen et al. | 324/756.03 |
| 2012/0049878 A1* | 3/2012 | Hung et al. | 324/756.03 |
| 2012/0067145 A1* | 3/2012 | Suzuki et al. | 73/866.5 |
| 2012/0187972 A1* | 7/2012 | Lee | 324/756.03 |
| 2013/0187676 A1* | 7/2013 | Washio et al. | 324/756.03 |
| 2013/0307574 A1* | 11/2013 | Meng | 324/756.03 |

* cited by examiner

COMBINED PROBE HEAD FOR A VERTICAL PROBE CARD AND METHOD FOR ASSEMBLING AND ALIGNING THE COMBINED PROBE HEAD THEREOF

FIELD OF THE INVENTION

The present invention relates to a combined probe head and a related method for assembling and aligning the combined probe head, and more particularly, to a combined probe head for a vertical probe card and method for assembling and aligning the combined probe head.

BACKGROUND OF THE INVENTION

During a wafer test, a probe card is usually used in a testing equipment for contacting the device under test (DUT) and transferring testing signals in order to obtain electrical properties of the DUT. The probe cards can be classified into a cantilever probe card (CPC) and a vertical probe card (VPC).

FIG. 1-1 and FIG. 1-2 are structural illustrative drawings of a conventional vertical probe card 1 according to the known art. The conventional vertical probe card 1 includes a printed circuit board 2, a space converting layer 3 disposed in one side of the printed circuit board 2, a probe head 4 disposed in one side of the space converting layer 3, and a plurality of probes 5 disposed in the probe head 4. The space converting layer 3 may be replaced by other structures, such as manual wire drawing traces connected between the printed circuit board 2 and a substrate, and the probe head 4 is disposed in one side of the substrate, such that the space converting layer 3 together with the other substitutable structures can be collectively called as a space transformer. When a chip is tested by using the vertical probe card 1, each probe 5 tip is able to be abutting against the test pads of the chip for electrical transmission. Each probe 5 can absorb the reversed stress through elastic deformation itself. The probe head 4 shown in FIG. 1-1 is a probe head having two dies. The probe head 4 includes an upper die 6, a lower die 7, and a locating plate 8. The upper die 6 and the lower die 7 can be combined to each other in order to form a layout space 9 of the probes between them, and the locating plate 8 is disposed within the layout space 9. There are a plurality of holes 10 disposed on the corresponding locations of the probes 5 of the upper die 6, the lower die 7, and the locating plate 8, respectively, wherein the plurality of holes 10 has a size corresponding to a diameter dimension of the probe 5. Hence, when the probes 5 are installed in line assembly, each probe 5 can pass through the corresponding holes 10 of the locating plate 8 and the lower die 7 and remain in a vertical configuration. After that, the locating plate 8 is covered by the upper die 6, such that the probes 5 can pass through the corresponding holes 10 of the upper die 6 to complete the assembly. FIG. 1-2 is a structural illustrative drawing of another conventional vertical probe card 4 having three dies according to the known art, which further includes a middle die 11 (MD) disposed between the upper die 6 and the lower die 7 and can be applied to the probes 5 having a longer length, thereby reducing degree of metalworking and assembly difficulty.

After frequent test operations have been performed on the vertical probe card 1, the probes 5 disposed in the probe head 4 may easily generate wear and abrasions of varying degrees. Hence, replacement and maintenance of the probes 5 are often required. In practice, during the process of replacing the probes 5, the upper die 6 must be removed from probe head 4 first. Then, the probe 5 to be replaced is taken out, and a new probe 5 is inserted thereon once more. However, the size or dimensions of the probes 5 is very small and precise, and the probes 5 are tightly aligned to each other. In addition, the locating plate 8 is a non-fixed or non-stationary structure, and thus the locating plate 8 can be easily turned back if the probe head 4 is removed from the upper die 6, or that the probe 5 is taken out, which may negatively affect other properly working probes 5 so as to be taken out together alongside. As a result, there-insertions of other replacement probes 5 are required, which may increase repair cost and thereby waste maintenance time and labor, especially probe cards having high pin count will be affected more seriously.

SUMMARY OF THE INVENTION

It is therefore one of the objectives of the present invention to provide a combined probe head to solve the above-mentioned problems in the prior art. The layout area of the probes in the vertical probe card can be divided into several regions, such that the mutual interference between probes can be avoided during repair process, in order to thereby reduce repair cost.

In order to achieve the above mentioned goal, a combined probe head is implemented by using the sub-probe heads or the upper sub-dies to differentiate the layout areas of the probes. According to one embodiment of the present invention, the combined probe head may include a locating plate and a plurality of sub-probe heads. The locating plate includes a plurality of fixed portions. Each sub-probe head includes a plurality of corresponding sub-dies and a plurality of probes inserted between the plurality of sub-dies, and each sub-probe head is assembled and fixed in the corresponding fixed portion in order to complete the assembly and alignment.

According to another embodiment of the present invention, the combined probe head may include a lower die and a plurality of upper sub-dies, in which the locations of the upper sub-dies are corresponding to a predetermined region of the lower die. Different layout areas of the probes are differentiated or segmented by using the upper sub-dies.

According to another embodiment of the present invention, a method for assembling and aligning a combined probe head is provided. In the method for assembling and aligning the first combined probe head, the combined probe head may include a locating plate and a plurality of sub-probe head, in which there are a plurality of probes inserted between the upper sub-die and the lower sub-die of each sub-probe head. After the sub-probe heads are assembled and fixed in the locating plate, an accurate alignment of each sub-probe head is achieved by using a probe alignment unit in order to position the proper locating distribution of all of the respective probes, and the positioned sub-probe heads are assembled and fixed in the locating plate.

Therefore, by adopting the embodiments of the present invention, the layout areas of a vertical probe card can be differentiated or segmented in order to avoid mutual interference under or during repair process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1-2 is a structural illustrative drawing of another conventional vertical probe card according to the known art.

FIG. 2-1 is a 3 dimensional exploded view of a combined probe head according to an embodiment of the present invention.

FIG. 2-2 is a cross-sectional view of a combined probe head according to the embodiment of the present invention.

FIG. 3-1 and FIG. 3-2 are a plurality of views illustrating a method for assembling a combined probe head according to an exemplary embodiment of the present invention.

FIG. 4-1 is a 3 dimensional exploded view of a combined probe head according to another embodiment of the present invention.

FIG. 4-2 is an assembly cross-sectional view of a combined probe head according to another embodiment of the present invention.

FIG. 5-1 is an assembly structural view of a combined probe head according to another embodiment of the present invention.

FIG. 5-2 is an assembly structural view of a die of a combined probe head according to yet another embodiment of the present invention.

DETAILED DESCRIPTION OF THE INVENTION

Figure 1:
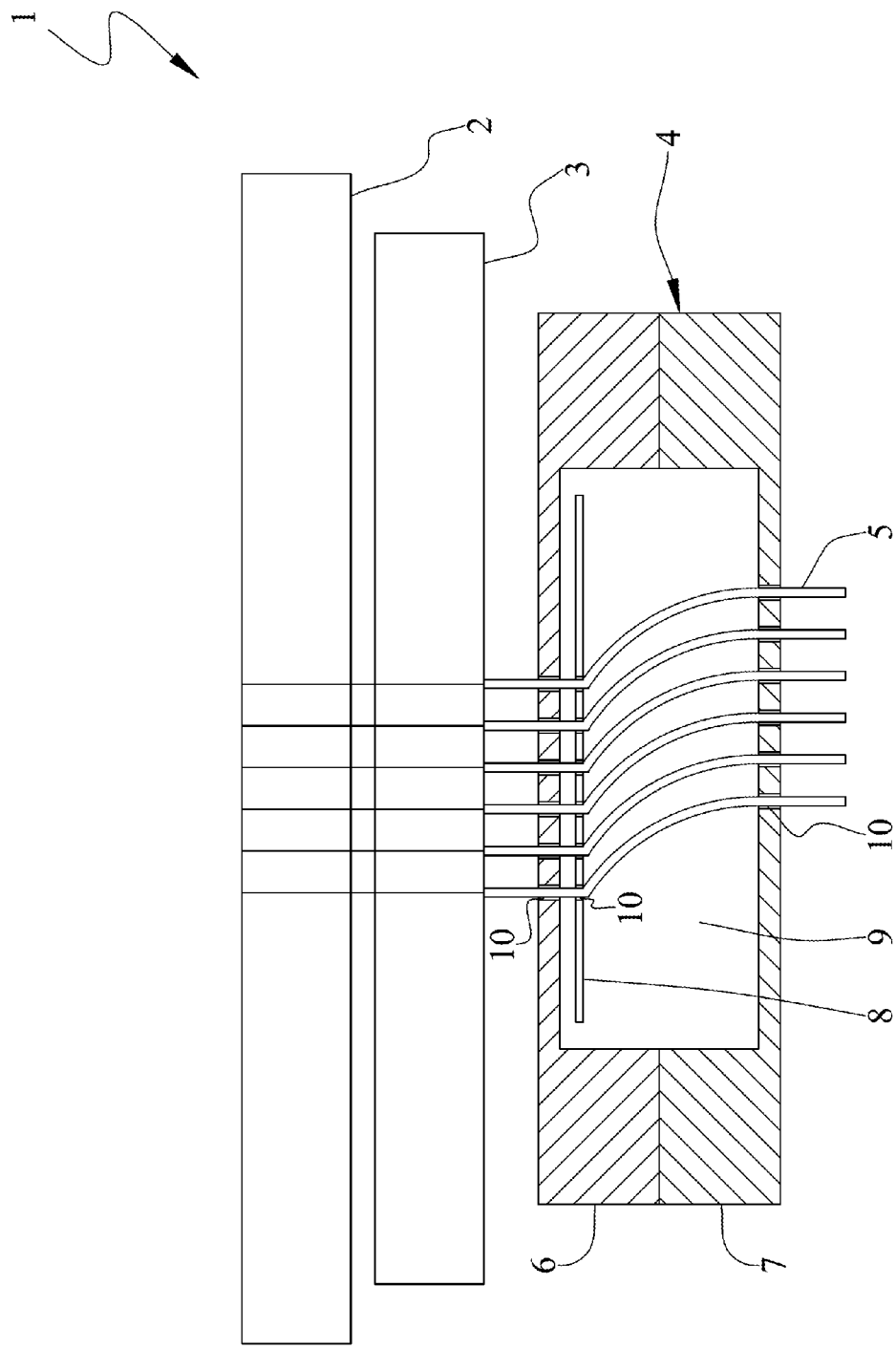
FIG. 1-1 is a structural illustrative drawing of a conventional vertical probe card according to the known art.

In order to facilitate the understanding of core techniques of the present invention, the drawing of spacers for assisting standings of the probes in the probe heads are omitted in the descriptions below. Regarding the detailed descriptions and techniques of the present invention, for different embodiment together with drawings are cited for illustration as below.

Embodiment 1

In this embodiment, a combined probe head 20 having three dies is provided. Please refer to FIG. 2-1. As shown, the combined probe head 20 may include an upper die (UD) 21, a middle die (MD) 22, a lower die (LD) 23, and a locating plate 24. The upper die 21, the middle die 22, and the lower die 23 include a plurality of upper sub-dies 210, a plurality of middle sub-dies 220, and a plurality of lower sub-dies 230, respectively. Be noted that a total number of the upper sub-dies 210 of the upper die 21, a total number of the middle sub-dies 220 of the middle die 22, and a total number of the lower sub-dies 230 of the lower die 23 are equal to each other, and the positions of the upper sub-dies 210, the middle sub-dies 220, and the lower sub-dies 230 are configured up and down respectively corresponding to each other. However, the total number of the upper sub-dies 210, the middle sub-dies 220, and the lower sub-dies 230 are not limited to any particular number, which is to be considered without affecting the vertical configuration and assembly operations of the probes. For example, the circular upper die 21 shown in FIG. 2-1 is substantially composed of four quarter-circular upper sub-dies 210; the circular middle die 22 is substantially composed of four quarter-circular middle sub-dies 220; and the circular lower die 23 is substantially composed of four quarter-circular lower sub-dies 230.

Figures 1, 3:
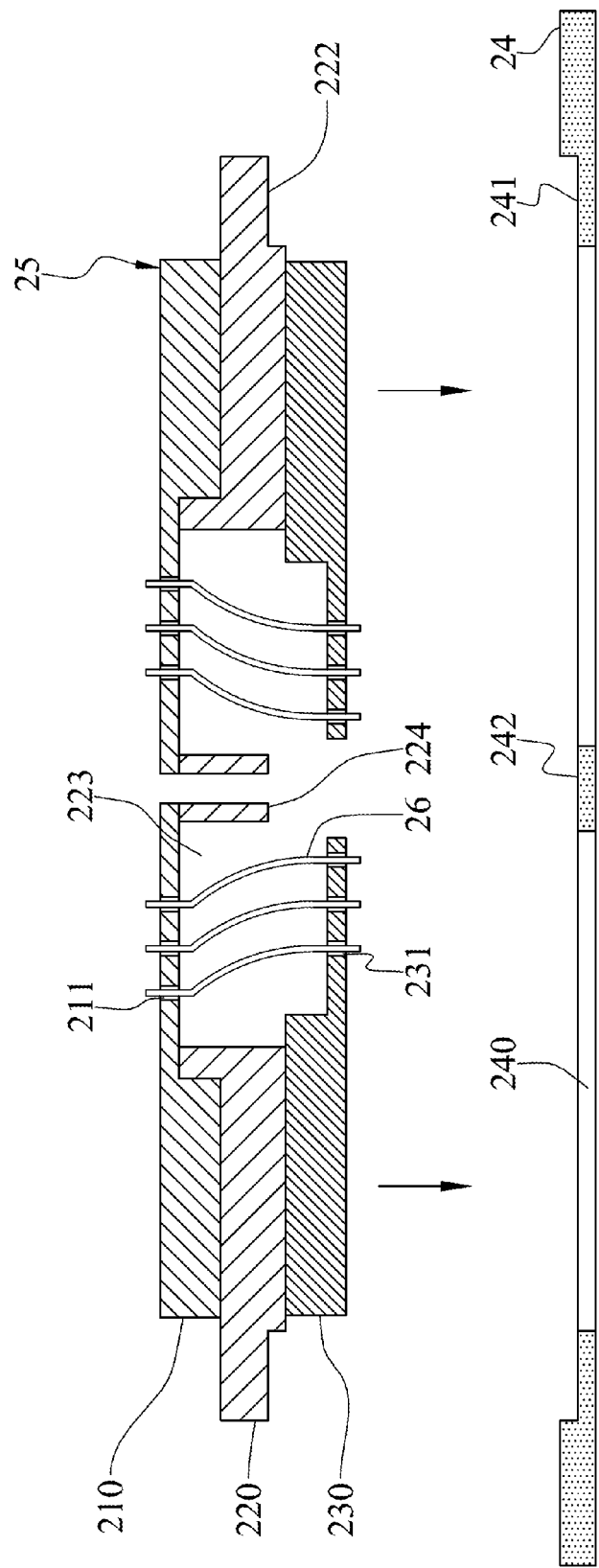
Figures 2, 3:
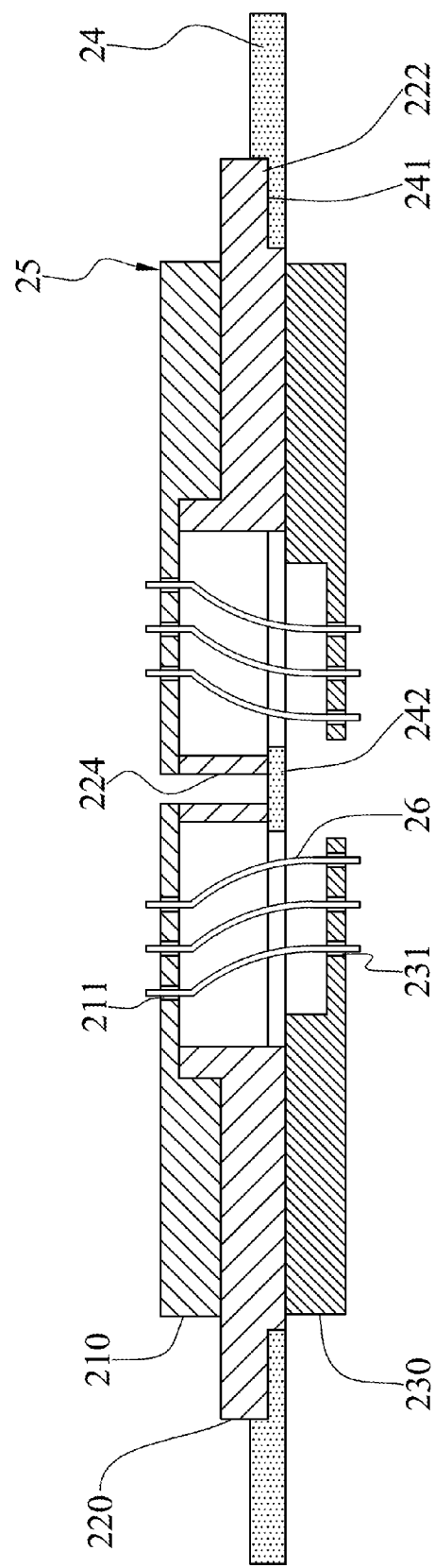

The locating plate 24 may include a plurality of fixed portions 240, in which a total number of the fixed portions 240 is at least equal to the total number of the upper sub-dies 210 of the upper die 21, the middle sub-dies 220 of the middle die 22, and the lower sub-dies 230 of the lower die 23, respectively. Therefore, when the upper sub-die 210, the middle sub-die 220, and the lower-sub-die 230 are combined with each other to form a sub-probe head 25 (as is shown in FIG. 3-1), the sub-probe head 25 can be assembled and fixed in the corresponding fixed portion 240, such that the sub-probe heads 25 and the locating plate 24 can form the combined probe head 20 to be disposed in a vertical probe card to perform test. The sub-probe heads 25 are disposed in the locating plate 24 in a horizontal alignment with each other, such that the locating plate 24 allows accurate positioning of the sub-probe heads 25. In addition, when all of the sub-probe heads 25 are assembled and fixed in the locating plate 24, a plurality of probes 26 located in different respective sub-probe heads 25 can be combined into a predetermined layout pattern in order to improve the test accuracy of the vertical probe card.

Figures 1, 2:
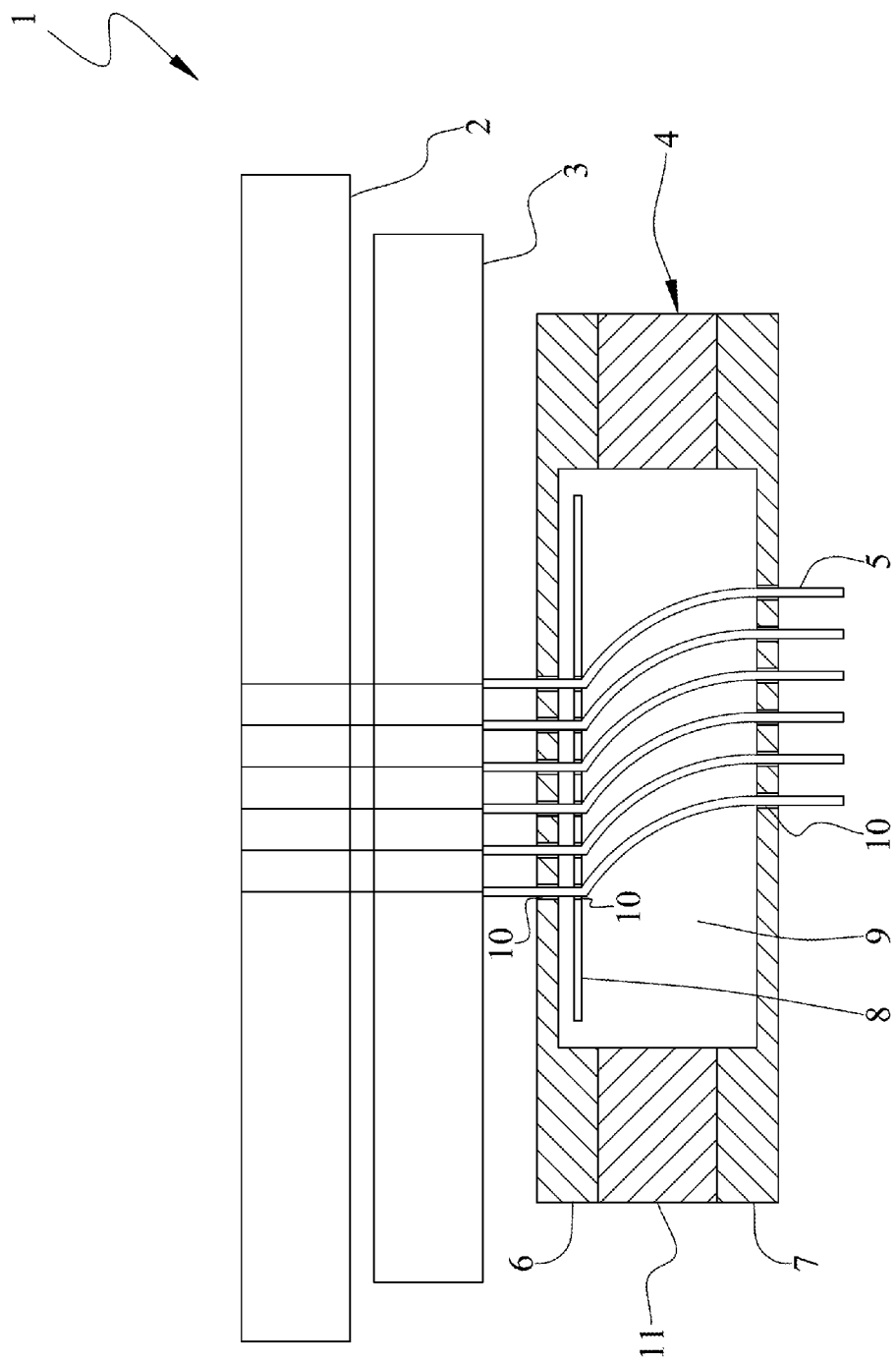
Figures 1, 2:
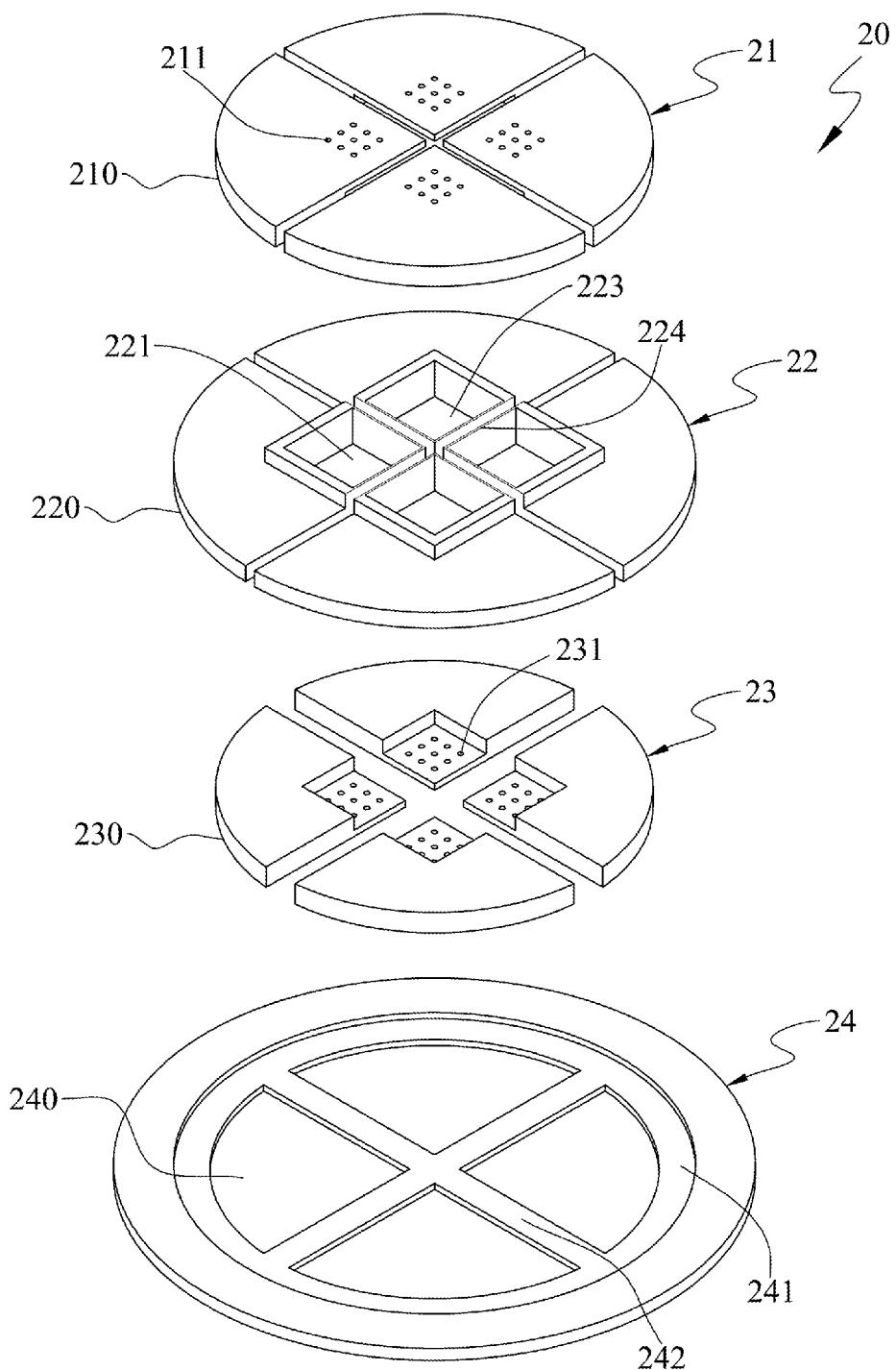
Figure 2:
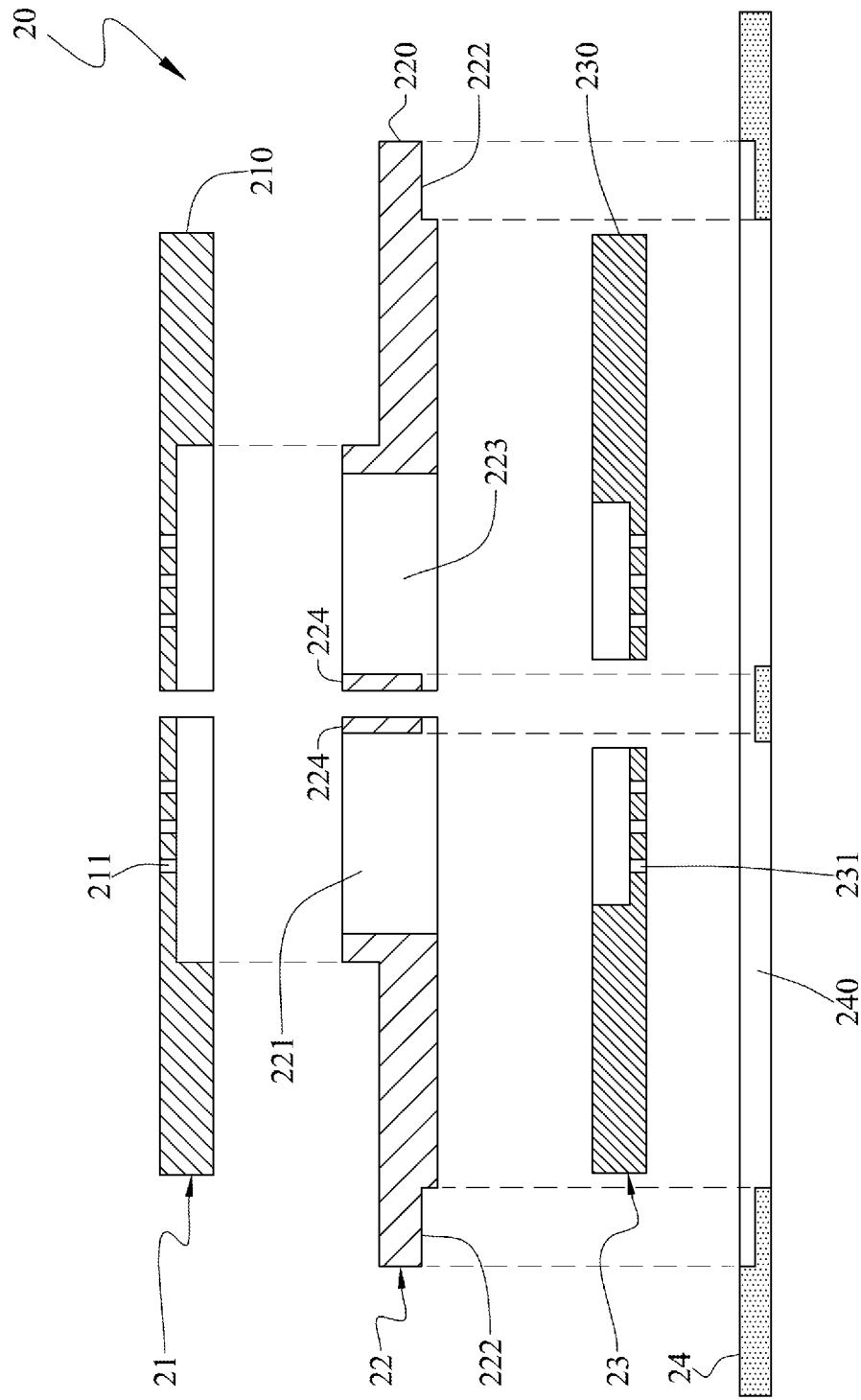

Please refer to FIG. 2-2 together with FIG. 2-1. FIG. 2-2 is a cross-sectional exploded view of the combined probe head 20 shown in FIG. 2-1. For example, each fixed portion 240 may have a size corresponding to a placement space or space requirement of the corresponding sub-probe head 25. A support portion 241 is formed around the circular rim in the placement space. A support beam structure 242 is formed between the placement spaces, such as the support beam structure 242 shown in FIG. 2-1, which defines the four fixed portions 240. Each middle sub-die 220 has an opening 221 and a leaning portion 222 (as is shown in FIG. 2-2), the opening 221 defines a sub-layout space 223 and forms a leaning beam structure 224 being surrounding a partial region of the opening 221. Operations of the leaning portion 222 and the leaning beam structure 224 will be detailed in the following. Besides, there are a plurality of corresponding holes 211, 231 disposed on the upper sub-dies 210 and the lower sub-dies 231 corresponding to the sub-layout spaces 223, such that two terminal ends of each probe can be inserted into the corresponding holes 211 and 231 of the upper sub-die 210 and the lower-sub die 230, respectively, and to be disposed in the sub-layout space 223.

Please refer to FIG. 3-1 together with FIG. 3-2. FIG. 3-1 and FIG. 3-2 are a plurality of views illustrating a method for assembling the combined probe head 25 according to an exemplary embodiment of the present invention. First, the middle sub-die 220 can be assembled and fixed in the lower sub-die 230, and then the corresponding probes 26 can be inserted in the holes 231 of the lower sub-die 230. After that, the upper sub-die 210 is fixedly combined with the middle sub-die 220 and the lower sub-die 230, such that two terminal ends of the probes 26 can be inserted into the corresponding holes 211, 231 of the upper sub-die 210 and the lower sub-die 230, respectively. Therefore, the upper sub-die 210, the middle sub-die 220, and the lower sub-die 230 can form the sub-probe head 25, as is shown in FIG. 3-1. Afterwards, each sub-probe head 25 can be inserted in the fixed portion 240 of the locating plate 24, such that the leaning portion 222 of the middle sub-die 220 is abutting against the support portion 241 of the locating plate 24, and the leaning beam structure 224 of the middle sub-die 220 is abutting or leaning against the support beam structure 242 of the locating plate 24 for supporting and positioning the middle sub-die 220, as is shown in FIG. 3-2. After the sub-probe heads 25 are assembled and fixed in the locating plate 24, the sub-probe heads 25 can be assembled and fixed in a space transformer of a conventional vertical probe card through the locating plate 24. That is, in this embodiment of the present invention, the combined probe head 20 is disposed in a space transformer of a vertical probe card.

In the above-mentioned embodiment, the assembly and lock mechanisms between the upper sub-dies 210, the middle sub-dies 220, and the lower sub-dies 230 and the assembly and lock mechanisms between the sub-probe head 25 and the locating plate 24 can be implemented by screw locking mechanisms, but is not being limited in the present invention. Regarding FIG. 3-2, the sub-probe heads 25 are locked in the locating plate 24 thorough the middle sub-dies 220. The locating plate 24 having a surface that is close to the lower sub-die 230 (i.e., the surface of the locating plate 24 facing the device under test, DUT) does not exceed the testing surface of the probes 26 of the lower sub-die 230 as being part of the operating considerations, such that the contact of the probes 26 and the DUT won't be affected by the locating plate 24, and thus the testing also thereby would not be affected. On the other hand, this embodiment can be applied to a vertical probe card with multi-DUT, whereby the leaning beam structures 224 formed by the middle sub-dies 220 can be viewed as a space formed by the layout space of the probes 26 for jumping the DUT. The so-called vertical probe card with multi-DUT means that the probe card can be used for testing a plurality of devices under test at the same time, for example, a plurality of dies or chips on a wafer can be tested at the same time. The so-called "jumping the DUT" means that the layout pattern of the vertical probe card with multi-DUT shows a regional segmented distribution, such that the probe needs to move across over at least one DUT when the probe card is under test, in order to test the DUT(s) sitting adjacent at the side of the jumped across DUT. In other words, when the wafer is touched by the probe, two adjacent chips won't be touched at the same time, and a designated chip is being jumped across for conducting testing.

Embodiment 2

Figures 1, 4:
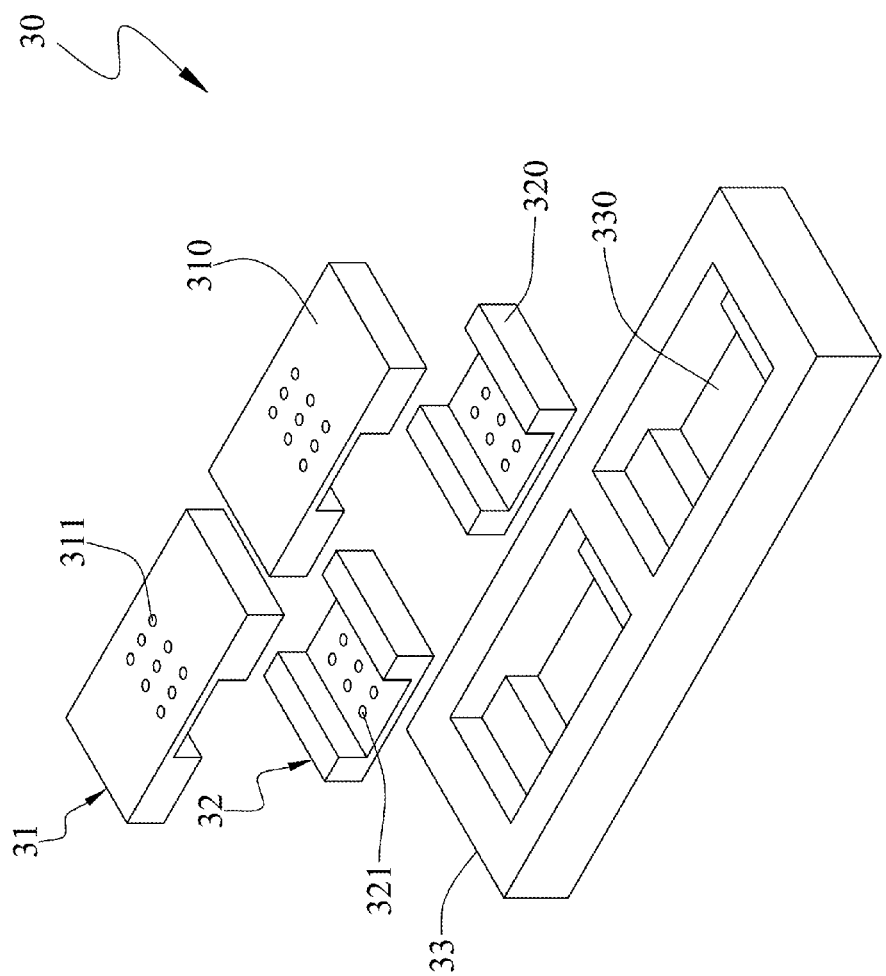
Figures 2, 4:
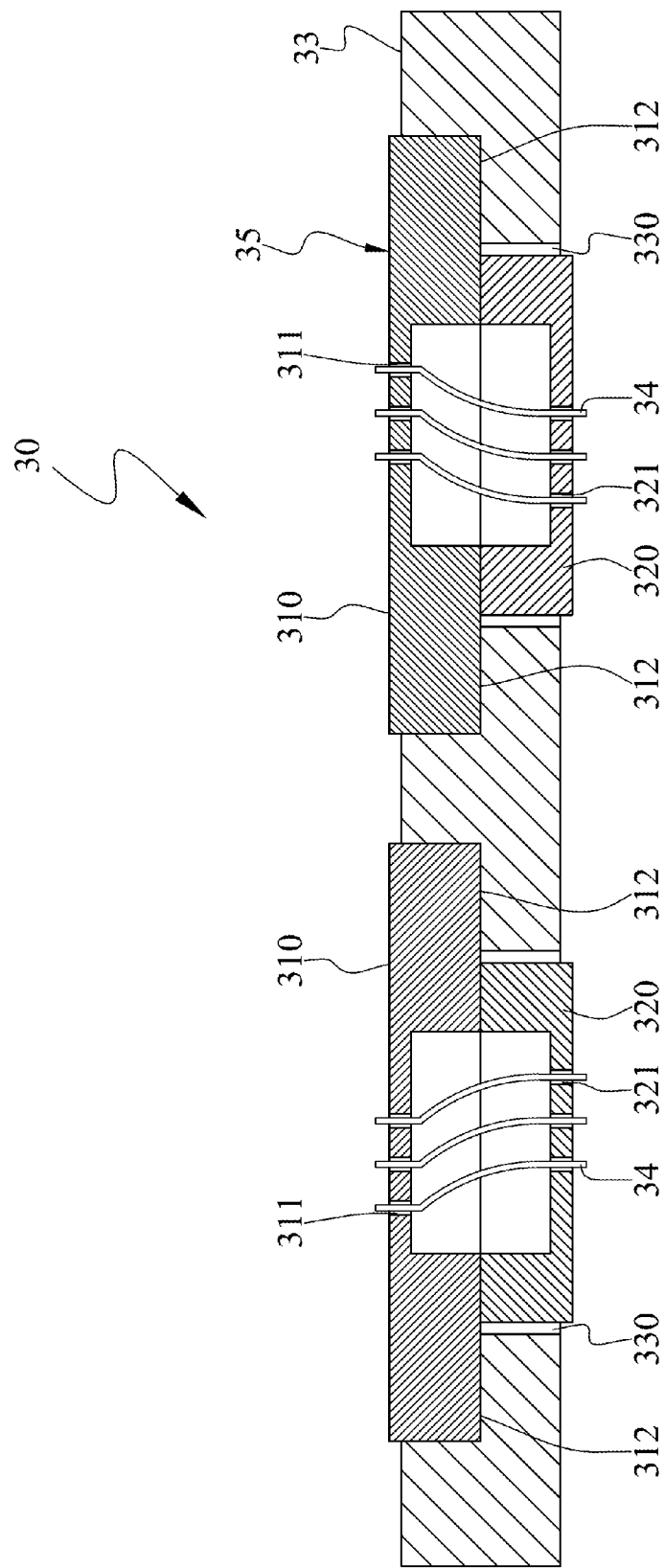

In Embodiment 2, a combined probe head 30 having two dies is provided. FIG. 4-1 is a 3D exploded view of the combined probe head 30 and FIG. 4-2 is an assembly cross-sectional view of the combined probe head 30. This embodiment can be applied to a vertical probe card with multi-DUT. The combined probe head 30 may include an upper die 31, a lower die 32, and a locating plate 33. The upper die 31 and the lower die 32 include a plurality of upper sub-dies 310 and a plurality of lower sub-dies 320, respectively. Be noted that a total number of the upper sub-dies 310 of the upper die 31 and a total number of the lower sub-dies 320 of the lower die 32 are equal to each other (as shown in FIG. 4-1, the total number is equal to two), and the positions of the upper sub-dies 310 and the lower sub-dies 320 are arranged up and down corresponding to each other. Besides, there are a plurality of corresponding holes 311, 321 disposed on the upper sub-dies 310 and the lower sub-dies 320, respectively, such that a plurality of probes 34 shown in FIG. 4-2 can be inserted between the upper sub-die 310 and the lower sub-die 320 in order to form a sub-probe head 35. The locating plate 33 includes a plurality of fixed portion 330, in which a total number of the fixed portions 330 is equal to the total number of the sub-probe heads 35. Therefore, the sub-probe head 35 can be assembled and fixed in the corresponding fixed portion 330, such that the alignment and positioning of the sub-probe heads 35 can be completed through the fixed portions 330 of the locating plate 33 in order to maintain the accuracy of the layout of the probes 34.

During assembling of the combined probe head 30, the corresponding probes 34 can be first inserted in the holes 321 of the lower sub-die 320. After that, the upper sub-die 310 is fixedly combined with the lower sub-die 320, such that the probes 34 can be inserted into the corresponding holes 311 of the upper sub-die 310 in order to form the sub-probe head 35. By making usage of the size variations available of the upper sub-dies 310 or the lower sub-dies 320 of the sub-probe heads 35, a leaning portion 312 can be formed and assembled in the fixed portions 330. In the abovementioned embodiment, a width of the upper sub-die 310 may be greater than a width of the lower sub-die 320, such that the peripheral area of the upper sub-die 310 is protruded from the lower sub-die 320 in order to form the leaning portion 312, as is shown in FIG. 4-2. The fixed portion 330 may be implemented by a placement space, such that the sub-probe head 35 can be inserted in the placement space, and can be assembled and fixed since the leaning portion 312 is leaned against a peripheral of the placement space. Similarly, a width of the lower sub-die 320 may be greater than a width of the upper sub-die 310 in order to form a protruded leaning portion, such that a peripheral of the lower sub-die 320 which is protruded from the upper sub-die 310 can be assembled and fixed in the fixed portion 330. Similarly, the assembly and locking mechanisms between the sub-probe heads 35 and the locating plate 33 can be implemented by screw locking mechanisms, but is not being limited in the present invention. After the sub-probe heads 35 are assembled and fixed in the locating plate 33, the sub-probe heads 33 can be assembled and fixed in a space transformer of a conventional vertical probe card through the locating plate 33. That is, the combined probe head 30 is disposed in a space transformer of a vertical probe card.

The methods for assembling and aligning the combined probe head 20 described in Embodiment 1 and the combined probe head 30 described in Embodiment 2 are also provided in the present invention. As above mentioned, the combined probe head 20, 30 includes a locating plate 24, 33 and a plurality of sub-probe heads 25, 35, wherein each sub-probe head 25, 35 has a plurality of probes 26, 34 inserted thereon. After the sub-probe heads 25, 35 are assembled and fixed in the locating plate 24, 33, the accurate alignment of each sub-probe head 25, 35 is completed by using a probe alignment unit in order to position the layout of the probes 26, 34. After that, the positioned sub-probe heads 25, 35 are assembled and fixed in the locating plate 24, 33.

Since each sub-die of the sub-probe heads 25, 35 can be formed by cutting a large-scale die, there may be a gap existed between the sub-dies. During assembling of the sub-probe head 25, 35, the relative positions between the sub-probe heads 25, 35 will affect the accuracy of the positions of the sub-probe heads 26, 34. Hence, a probe alignment unit is required to ensure the accuracy of the positions of the probes 26, 34 of the sub-probe heads 25, 35. In the above embodiment, the probe alignment unit may be a film having a locating distribution of the probes. As a result, the probes 26, 34 of the sub-probe heads 25, 35 can be positioned by calibrating the locating distribution of the probes on the film. In another embodiment, the probe alignment unit can be implemented by an alignment machine.

Be noted that, the locating plate 24, 33 and the sub-probe heads 25, 35 may include a plurality of locking holes (not shown), respectively. One of the locking holes located on the locating plate 24, 33 and the locking holes located on the sub-probe heads 25, 35 may have an aperture greater than a screw diameter of the screw for the locking holes. Therefore, the sub-probe heads 25, 35 can be inserted in the locking holes by means of the screws and can be initially assembled on the locating plate 24, 33. After adjusting their relative positions by using relative displacement, the screws are used for locking and fixing the sub-probe heads 25, and the locating plate 24, 33 in order to maintain the proper positioning.

The abovementioned method can be applied to a combined probe head which has separately-formed sub-dies and separately-formed opened holes 211, 231, 311, and 321. The abovementioned method can be applied to a combined probe head which has sub-probe heads 25, 35 having a plurality of synchronous machined sub-dies and a plurality of the corresponding holes 211, 231, 311, and 321.

Embodiment 3

In the Embodiment 3, another combined probe head 40 is provided, which can be applied to a vertical probe card with high pin count and/or multi-DUT. Please refer to the assembly structural view shown in FIG. 5-1. The combined probe head 40 may include an upper die 41, a lower die 42, and a locating plate 43. The upper die 41 includes a plurality of upper sub-dies 410 (such as, the three upper-sub-dies 410 shown in FIG. 5-1), wherein the upper sub-dies 410 are in horizontal alignment with each other, and there are a plurality of holes 411 disposed on each of the upper sub-dies 410. The lower die 42 includes a plurality of layout areas 420 of the probes, wherein there is a plurality of holes 421 disposed on each of the layout areas 420. Therefore, each upper sub-die 410 can correspond to one of the layout areas 420 to be disposed on the lower die 42, such that a plurality of probes 44 can be inserted between the upper sub-dies 410 and the layout areas 420 of the lower die 42. The upper sub-dies 410 can be directly disposed on the lower die 42 and fixedly attached to the lower die 42. After that, the lower die 42 can be assembled and fixed in the locating plate 43, and the sub-probe heads can be assembled and fixed in a space transformer of a conventional vertical probe card through the locating plate 43, such that the combined probe head 40 is disposed in a space transformer of the conventional vertical probe card. Similarly, the assembly and locking mechanisms between the upper die 41 and the lower die 42 and the assembly and locking mechanisms for assembling and fixing the lower die 42 in the locating plate 43 can be implemented by screw locking mechanisms, but is not being limited in the present invention. The layout pattern of the layout areas 420 of the probes can be applied to a multi-DUT or a single DUT.

Figures 1, 5:
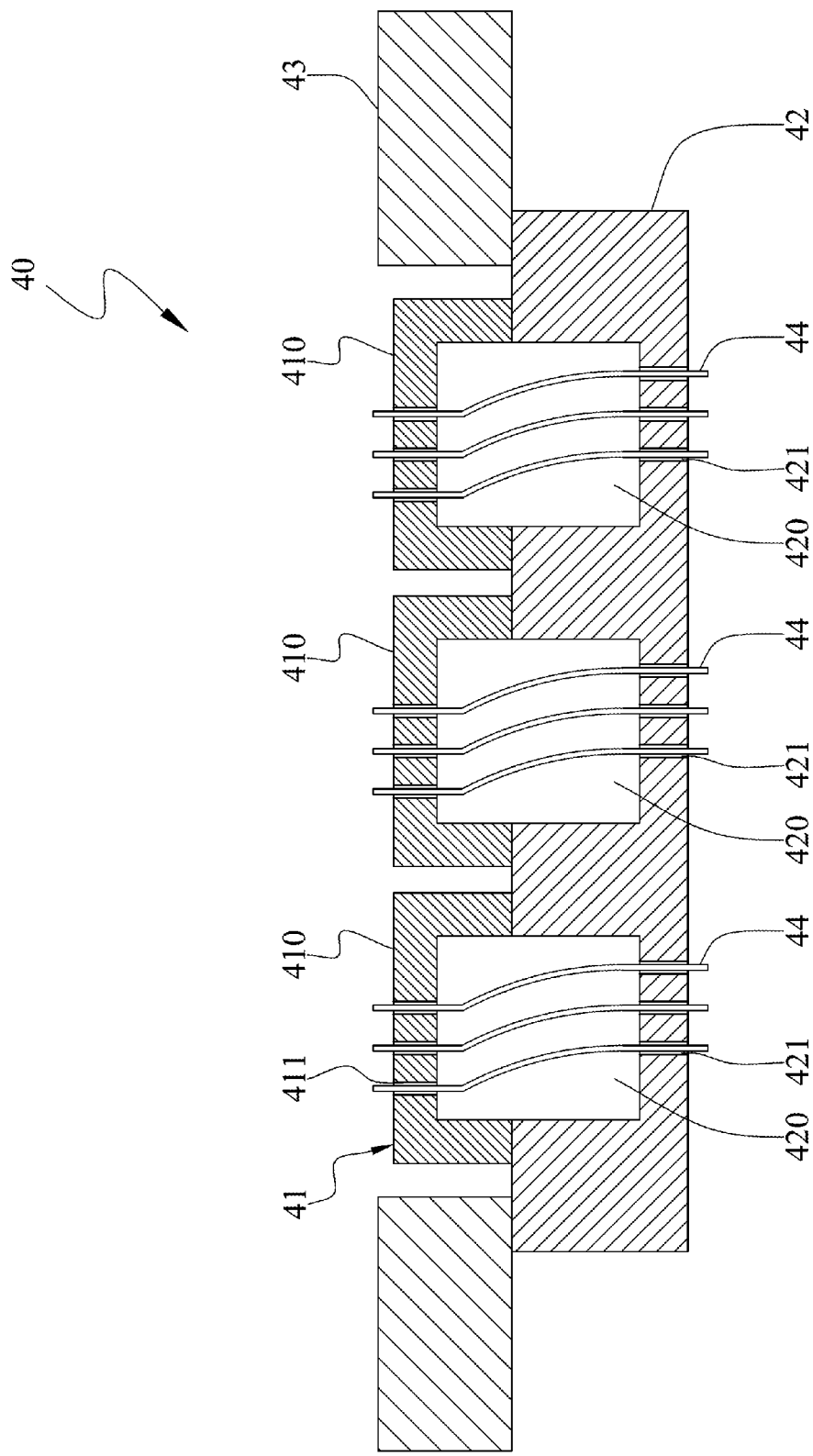
Figures 2, 5:
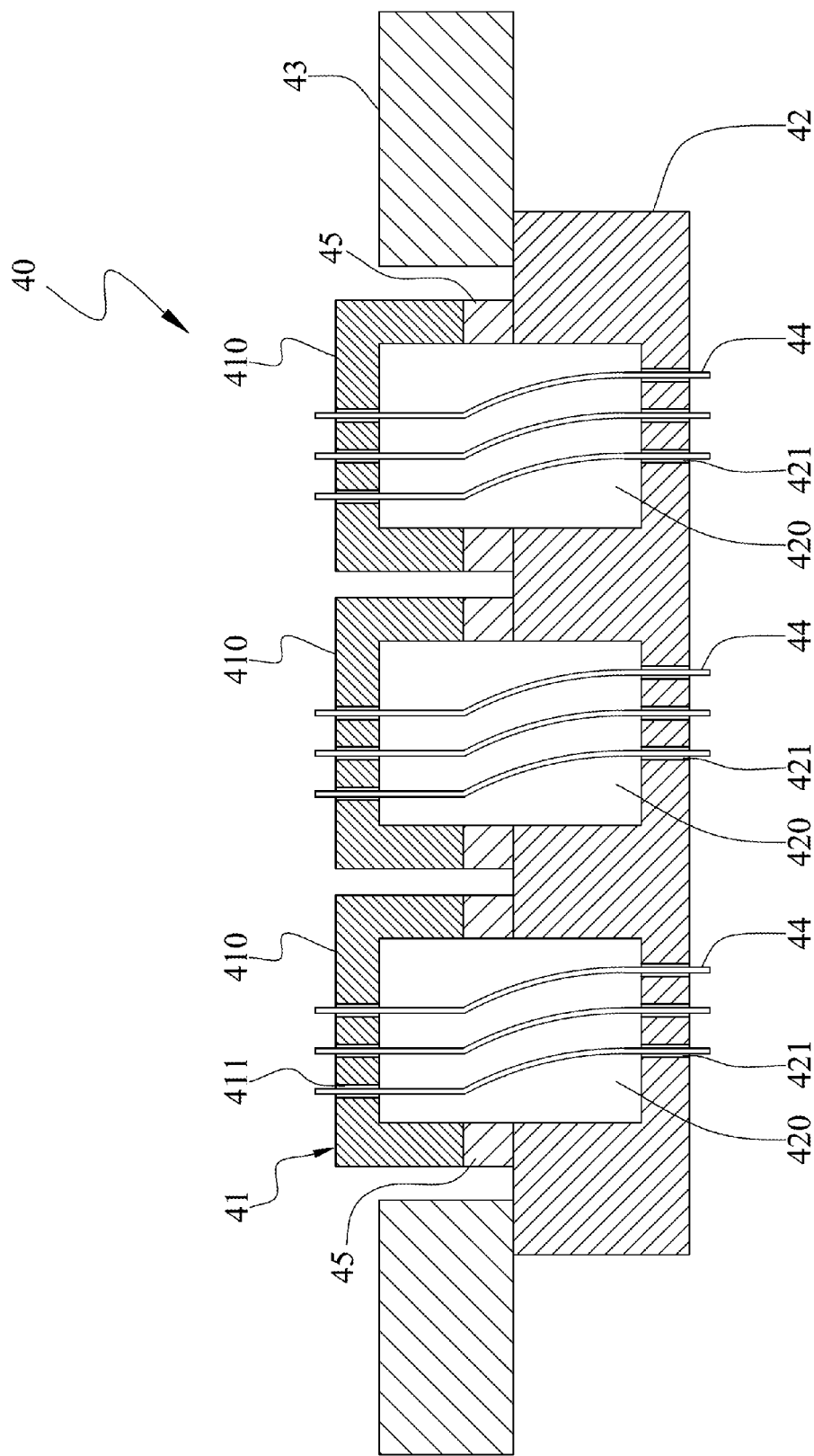

Besides, please refer to the assembly structural view of the combined probe head 40 shown in FIG. 5-2. In this embodiment, the combined probe head 40 may further include a plurality of middle sub-dies 45, wherein two adjacent middle sub-dies 45 are in horizontal alignment with each other, and each middle sub-die 45 corresponds to the layout area 420 of the lower die 42, and is assembled and fixed in the lower die 42. Be noted that the layout area 420 is sequentially composed of the upper sub-die 410, the middle sub-die 45, and the lower die 42. Therefore, by adding the middle sub-dies 45, the length of the probes can be effectively matched to allow for flexible usage. In addition, the middle sub-dies 45 can be combined into a single-piece structure in order to form a single middle die being directly assembled and disposed on the lower die 42. Certainly, the middle die includes a layout area of probes which is disposed corresponding to the layout area of the lower die 42, and each upper sub-die 410 can be directly assembled and disposed in the layout area of the middle die. What calls for special attention is that: the locating plate 43 can be combined and assembled with the middle die, and can be directly assembled and disposed in the space transformer of the vertical probe card through the locating plate.

Embodiment 4

Figure 6:
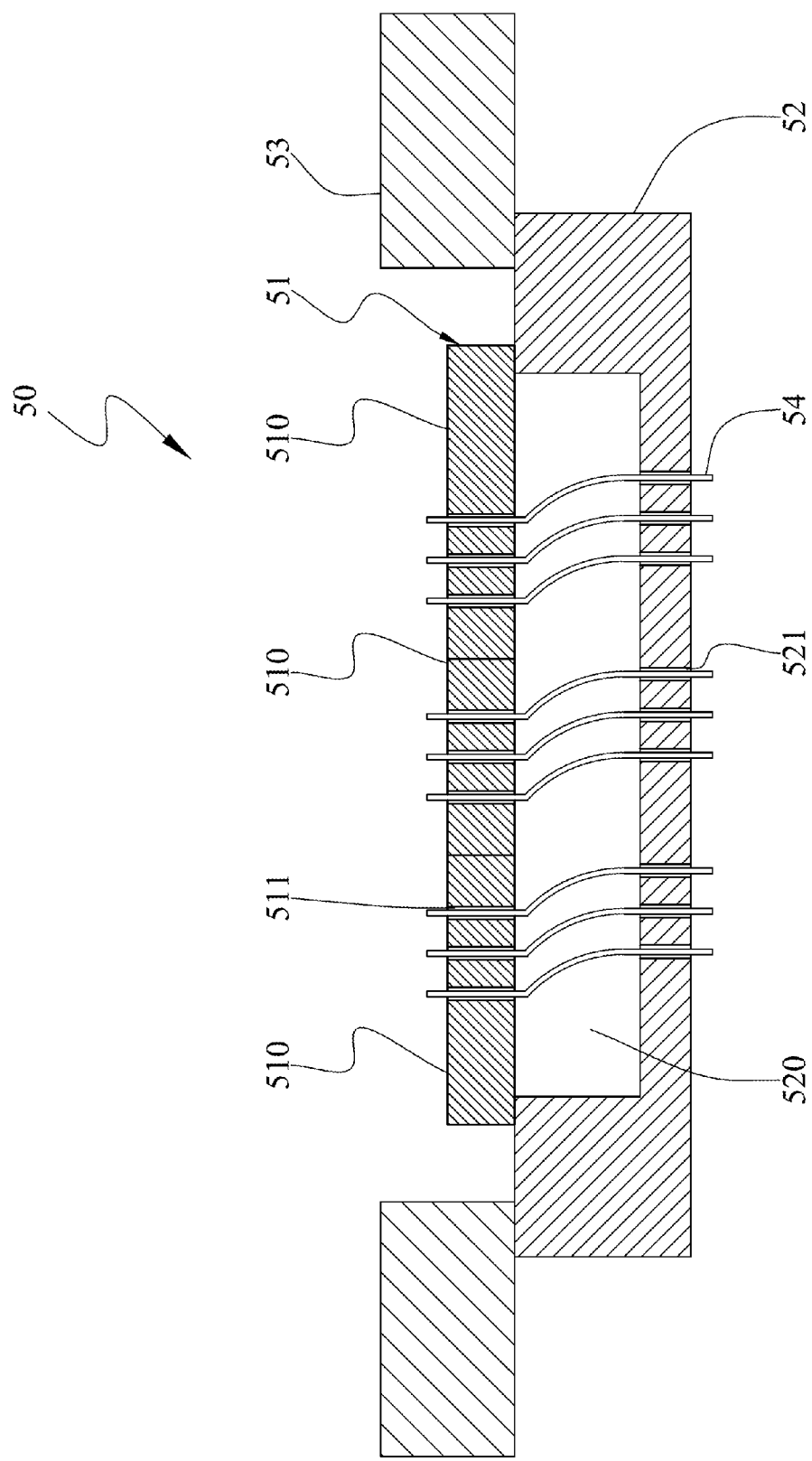
FIG. 6 is an assembly structural view of a combined probe head according to still another embodiment of the present invention.

In Embodiment 4, another combined probe head 50 is provided, which can be applied to a vertical probe card with high pin count and/or a (large-scale) single-DUT. Please refer to the assembly structural drawing of the combined probe head 50 shown in FIG. 6. The combined probe head 50 may include an upper die 51, a lower die 52, and a locating plate 53. The upper die 51 includes a plurality of upper sub-dies 510, and there is a plurality of holes 511 disposed on each of the upper sub-dies 510. The lower die 52 includes a layout area 520 of probes, and there is a plurality of holes 521 disposed on the layout area 520. Therefore, each upper sub-die 510 can correspond to a part of the layout area 520 and is disposed on the lower die 52. After the upper sub-dies 510 are orderly and closely aligned in the layout area 520, the probes 54 are inserted between the upper sub-dies 510 and the layout areas 520 of the lower die 54. After all the upper sub-dies 510 are disposed on the lower die 52, the lower die 52 can be assembled and fixed on the locating plate 53 (such as, via screw and locking mechanisms). By locking the locating plate 53 with other structures of the vertical probe card, the upper die 51, the lower die 52, and a space convertor of the vertical probe card can be assembled and fixed to each other. The joining together of the upper die 510 and the lower die 52 can be implemented by screw and lock mechanisms. However, only the relative relationship between the upper sub-dies 510, the layout area 520, and the lower die 52 is shown in FIG. 6, and the actual fixing portion of the upper sub-dies 510 and the lower die 52 is not shown in FIG. 6. The difference between Embodiment 4 and Embodiment 3 is that: the probes 54 inserted in the layout area 520 in this embodiment (Embodiment 4) have a layout pattern corresponding to a single-DUT. Similarly, in this embodiment, a middle die structure mentioned in the embodiment above can be added into the combined probe head 50 for flexible use. That is, by adding a middle die or a plurality of middle sub-dies, the length of the probes 54 can be effectively configured to match.

In comparison with the combined probe head 40 in the Embodiment 3 and the combined probe head 50 in the Embodiment 4, another combined probe head is provided in the present invention. Please refer to FIG. 5-1 and FIG. 5-2. The difference between the combined probe head of this embodiment and the combined probe head 40 in Embodiment 3 is that: the structures of the upper die 41 and the lower die 42 are exchanged or switched. That is to say, the upper sub-dies of the upper die 41 are switched to be disposed in place of the lower die 42, and the layout area of the lower die 42 are switched to be disposed in place of the upper die 41, and the connectivity of the other structures remains the same. Similarly, please refer to FIG. 6. The difference between the combined probe head of this embodiment and the combined probe head 50 in Embodiment 4 is that: the structures of the upper die 51 and the lower die 52 are exchanged or switched. The locating plate 53 can also be used for assembling and fixing the upper die or the middle die as well, and further description is omitted here for brevity.

In summary, a combined probe head is provide in the present invention, wherein the upper die and/or the lower die of the probes can be divided into a plurality of sub-dies. As shown in Embodiment 1 and Embodiment 2, the probes can be combined into sub-probe heads in advance through the sub-dies, and then the sub-probe heads can be assembled and fixed on the locating plate so as to form the combined probe head disclosed in various embodiments of the present invention. As a result, the repair area can be isolated or standalone, such that the replacements of the probes can be performed separately to avoid errors relating to the lifting of the probes in the non-repairing/working area during the repair process, which may waste time and increase difficulty to repair the probes. Furthermore, regarding the probe head with high pin count, the probes are manually disposed in the probe head during the assembly process by adopting conventional method. For example, if a vertical probe card has 8000 probes and only 2000 probes can be assembled by one person within one specified unit of time, four people and four specified units of time are required to complete the assembly of the vertical probe card. Since the combined probe card is independently divided into "n" number of sub-probe heads in the present invention, the assembly process of the probes can be can be performed by n number of people simultaneously. The total time-taken of the present invention is merely one-nth of the total time-taken of the convention method in comparison, which thereby can shorten the assembly time and significantly increase the assembly efficiency. On the other hand, as shown in Embodiment 3 and Embodiment 4, by dividing the upper die into a plurality of upper sub-dies, the replacements of the probes can be performed separately to avoid affecting the layout accuracy of the other non-repairing/working areas. By reference to the modified structures of the Embodiment 3 and Embodiment 4 (that is, the lower die is divided into a plurality of lower sub-dies), the modified structures can maintain advantages of Embodiment 3 and Embodiment 4 as well as the advantages of Embodiment 1 and Embodiment 2 (i.e., the probes can be assembled in the n number of lower sub-dies by several people, and can be directly disposed on the upper die in order to shorten the assembly time and increase the assembly efficiency) at the same time. The abovementioned advantages are especially obvious when the combined probe head is applied to a vertical probe card with a large-scale DUT and high pin count probes.

Those skilled in the art will readily observe that numerous modifications and alterations of the device and method may be made while retaining the teachings of the invention.

What is claimed is:

1. A combined probe head, being disposed in a space transformer of a vertical probe card, the combined probe head comprises:
    a locating plate, comprising a plurality of fixed portions and a support beam structure, wherein the fixed portions are defined by the support beam structure; and
    a plurality of sub-probe heads, the sub-probe heads are disposed in horizontal alignment with each other, wherein each sub-probe head comprises:
    an upper sub-die, a lower sub-die, and a plurality of probes being inserted between the upper sub-die and the lower sub-die,
    and each sub-probe head is assembled and fixed in the corresponding fixed portion;
    the sub-probe head further comprises:
    a middle sub-die, wherein for each sub-probe head, the middle sub-die is disposed between the upper sub-die and the lower sub-die.

2. The combined probe head according to claim 1, wherein each fixed portion has a size corresponding to a placement space of the corresponding sub-probe head.

3. The combined probe head according to claim 1, wherein for each sub-probe head, a width of the upper sub-die is greater than a width of the lower sub-die in order to form a leaning portion; and each sub-probe head is leaned against a peripheral of the fixed portion through the leaning portion so as to be assembled and fixed in the locating plate.

4. The combined probe head according to claim 1, wherein the middle sub-die of each sub-probe head further comprises a leaning portion, and the sub-probe head is leaned against a peripheral of the fixed portion through the lean portion, so as to be assembled and fixed in the locating plate.

5. The combined probe head according to claim 1, wherein the middle sub-die of each sub-probe head further comprises a leaning beam structure, such that the leaning beam structure is leaned against the support beam structure.

6. The combined probe head according to claim 1, wherein the locating plate and the sub-probe heads comprises a plurality of corresponding locking holes, respectively, and one of the locking holes located on the locating plate and the locking holes located on the plurality of sub-probe heads has an aperture greater than a screw diameter for the screw for the locking holes for locking and fixing the plurality of locking holes.

7. A combined probe head, being disposed in a space transformer of a vertical probe card, the combined probe head comprises:
    a locating plate, comprising a support beam structure and a plurality of fixed portions, wherein the fixed portions are defined by the support beam structure;
    a lower die, comprising a plurality of layout areas of probes;
    a plurality of upper sub-dies, wherein two adjacent upper sub-dies are disposed in horizontal alignment with each other, and the locations of the upper sub-dies are corresponding to the layout areas of the lower die, respectively;
    a plurality of probes, wherein two terminal ends of each probe are corresponding to the layout areas, and are inserted between the upper sub-die and the lower die, respectively; and
    a plurality of middle sub-dies, wherein two adjacent middle sub-dies are in horizontal alignment with each other, the middle sub-dies are corresponding to the layout areas of the lower die, and are assembled and fixed in the lower die, and each layout area is sequentially composed of the upper sub-die, the middle sub-de, and the lower die.

8. The combined probe head according to claim 7, wherein each upper sub-die is corresponding to the layout areas, and is assembled and fixed in the lower die.

9. The combined probe head according to claim 7, further comprising:
    a middle die, directly disposed on the lower die, wherein the middle die comprises a layout area corresponding to the layout area of the lower die, and each upper sub-die is directly assembled and fixed in the layout area of the middle die.

10. The combined probe head according to claim 9, wherein the middle die is assembled and fixed in the locating plate, and is directly assembled and fixed in a space transformer of the vertical probe card through the locating plate.

11. The combined probe head according to claim 7, wherein the upper die is assembled and fixed in the locating plate, and the combined probe head is assembled and fixed in a space transformer of the vertical probe card through the locating plate.

12. A combined probe head, being disposed in a space transformer of a vertical probe card, the combined probe head comprises:
    a locating plate, comprising a support beam structure and a plurality of fixed portions, wherein the fixed portions are defined by the support beam structure;
    an upper die, comprising a plurality of layout areas;
    a plurality of lower sub-dies, wherein two adjacent lower sub-dies are disposed in horizontal alignment with each other, and the locations of the plurality of lower sub-dies are corresponding to the plurality of layout areas of the upper die, respectively;
    a plurality of probes, wherein two terminal ends of each probe are inserted between the corresponding lower sub-die and the upper die, respectively; and
    a middle die, directly disposed on the upper die, wherein the middle die comprises a layout area corresponding to the layout area of the upper die, and each lower sub-die is directly assembled and fixed in the layout area of the middle die.

13. The combined probe head according to claim 12, wherein each lower sub-die is corresponding to the plurality of layout areas of the lower die and is assembled and fixed in the upper die.

14. The combined probe head according to claim 12, further comprising:
   a plurality of middle sub-dies, wherein two adjacent middle sub-dies are in horizontal alignment with each other, the middle sub-dies are assembled and fixed in the layout areas of the upper die, and each layout area is sequentially composed of the upper die, the middle sub-de, and the lower sub-die.

15. The combined probe head according to claim 12, wherein the middle die is assembled and fixed in the locating plate, and is directly assembled and fixed in a space transformer of the vertical probe card through the locating plate.

16. The combined probe head according to claim 12, wherein the upper die is assembled and fixed in the locating plate, and the combined probe head is assembled and fixed in a space transformer of the vertical probe card through the locating plate.

17. A method for assembling and aligning a combined probe head, the combined probe head comprising a locating plate and a plurality of sub-probe heads, the locating plate comprising a support beam structure and a plurality of fixed portions, the fixed portions are defined by the support beam structure, each sub-probe head comprising an upper sub-die and a lower sub-die, and a plurality of probes are inserted between the upper sub-die and the lower sub-die and a middle sub-die, the sub-probe head is sequentially composed of the upper sub-die, the middle sub-die, and the lower sub-die, including the method steps:
   assembling and locking the sub-probe heads in the locating plate through the middle sub-dies;
   completing an accurate alignment of each sub-probe head after the sub-probe heads are assembled and fixed by the support beam structure of the locating plate by using a probe alignment unit in order to position a locating distribution of all the probes, after the positioned sub-probe heads are assembled and fixed in the locating plate.

18. The method according to claim 17, wherein the probe alignment unit is a film having a locating distribution of the probes, and the sub-probe heads is positioned by calibrating the locating distribution of the probes on the film.

* * * * *